(12) United States Patent
Ikoma et al.

(10) Patent No.: US 7,019,676 B2
(45) Date of Patent: Mar. 28, 2006

(54) D/A CONVERTER (75) Inventors: Heiji Ikoma, Ikoma-gun (JP); Koji Oka, Ibaraki (JP)

(73) Assignee: Matsushita Electric Industrial Co, Ltd., Osaka (JP)

( * ) Notice: Subject to any disclaimer, the term of this patent is extended or adjusted under 35 U.S.C. 154(b) by 0 days.

(21) Appl. No.: 10/864,376

(22) Filed: Jun. 10, 2004

(65) Prior Publication Data
US 2005/0001752 A1 Jan. 6, 2005

(30) Foreign Application Priority Data
Jun. 12, 2003 (JP) .............................. 2003-167555

(51) Int. Cl.
H03M 1/66 (2006.01)
H03M 1/00 (2006.01)

(52) U.S. Cl. ...................... 341/144; 341/136
(58) Field of Classification Search ................ 341/144, 341/136, 118, 120, 154; 29/831; 324/765; 365/201; 438/14, 17
See application file for complete search history.

(56) References Cited

U.S. PATENT DOCUMENTS

| 4,393,370 A | * | 7/1983 | Hareyama | 341/136 |
| 5,001,481 A | * | 3/1991 | Lee | 341/136 |
| 5,136,293 A | * | 8/1992 | Matsuo et al. | 341/144 |
| 5,399,505 A | * | 3/1995 | Dasse et al. | 438/17 |
| 5,701,666 A | * | 12/1997 | DeHaven et al. | 29/831 |
| 5,703,582 A | * | 12/1997 | Koyama et al. | 341/120 |
| 5,798,723 A | * | 8/1998 | Fong | 341/136 |
| 5,841,382 A | | 11/1998 | Walden et al. | 341/120 |
| 6,198,418 B1 | | 3/2001 | Ishizuka | 341/144 |
| 6,259,267 B1 | * | 7/2001 | Fujiwara | 324/765 |
| 6,310,568 B1 | * | 10/2001 | Kurooka | 341/144 |
| 6,337,648 B1 | | 1/2002 | Kiriaki | 341/154 |
| 6,352,868 B1 | * | 3/2002 | Yang | 438/14 |
| 6,411,116 B1 | * | 6/2002 | DeHaven et al. | 324/765 |
| 6,509,854 B1 | * | 1/2003 | Morita et al. | 341/144 |
| 6,562,636 B1 | * | 5/2003 | Richmond et al. | 438/14 |
| 6,633,502 B1 | * | 10/2003 | Iwasaki | 365/201 |
| 6,683,549 B1 | * | 1/2004 | Kinugasa | 341/136 |
| 6,747,583 B1 | * | 6/2004 | Tucholski et al. | 341/118 |
| 6,778,117 B1 | * | 8/2004 | Johnson | 341/144 |
| 6,897,799 B1 | * | 5/2005 | Harberts et al. | 341/144 |
| 6,903,671 B1 | * | 6/2005 | Kwon et al. | 341/136 |
| 6,917,316 B1 | * | 7/2005 | Blackburn | 341/118 |

FOREIGN PATENT DOCUMENTS

JP 06005677 1/1994

* cited by examiner

*Primary Examiner*—Patrick Wamsley
(74) *Attorney, Agent, or Firm*—Wenderoth, Lind & Ponack, L.L.P.

(57) ABSTRACT

A current output type D/A converter for converting a digital signal into an analog signal comprises a control signal input terminal for receiving a control signal supplied from the outside, and an output load element having a switching mechanism for electrically connecting or disconnecting the output load element to/from an analog output node on the basis of the control signal applied to the control input terminal.

19 Claims, 6 Drawing Sheets

D/A CONVERTER

FIELD OF THE INVENTION

The present invention relates to a D/A converter for converting a digital signal into an analog signal and, more particularly, to a technique for enabling a wafer-level burn-in test for a D/A converter.

BACKGROUND OF THE INVENTION

Recently, in order to take advantage of inexpensive CMOS, a system LSI in which a digital circuit and an analog circuit are combined on a single chip has been actively manufactured.

In such LSI, an A/D converter for converting an analog signal into a digital signal and a D/A converter for converting a digital signal into an analog signal are used at an interface between the LSI and the outside, with few exceptions.

Particularly in a LSI for video or communication, a current output type D/A converter capable of high-speed operation is indispensable. Generally, the current output type D/A converter has versatility in usage conditions.

To be specific, a resistor for output load and a resistor for current value setting are externally connected to the LSI so as to set analog output current and voltage according to actual usage conditions of the LSI, and further, a reference voltage for current value setting is inputted.

In order to screen an initial failure of the current output type D/A converter, a burn-in test is executed under the state where a wafer that is completed through a diffusion process is packaged (hereinafter referred to as "package burn-in").

Figure 6:
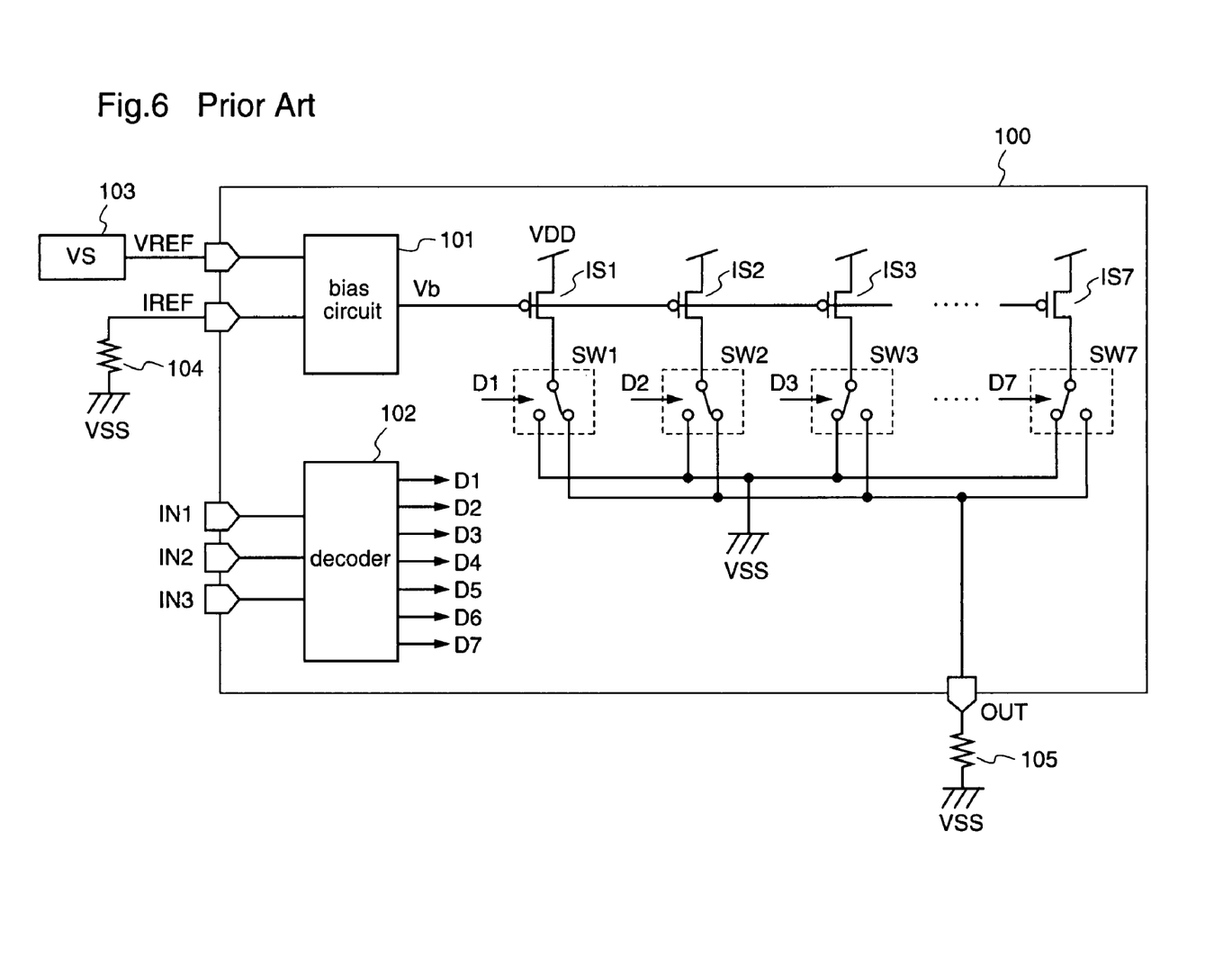
FIG. 6 is a diagram illustrating the conventional D/A converter.

FIG. 6 is a circuit diagram illustrating a conventional current output type D/A converter 100. In FIG. 6, three bits of digital signals are converted into analog signals.

The conventional current output type D/A converter 100 comprises a reference voltage input terminal VREF, a reference resistor connection terminal IREF, digital input terminals IN1~IN3, a bias circuit 101 as a voltage generation circuit, a decoder 102, current supply transistors IS1~IS7, differential switches SW1~SW7, and an analog output terminal OUT.

The reference voltage input terminal VREF is a terminal for applying a reference voltage from an external power supply 103 to the bias circuit 101. The reference resistor connection terminal IREF is a terminal for connecting the bias circuit 101 and an external resistor 104.

The bias circuit 101 is a voltage generation circuit for generating a bias voltage Vb, in accordance with the voltage supplied from the power supply 103 and inputted to the reference voltage input terminal VREF, and the external resistor 104 connected to the reference resistor connection terminal IREF.

The decoder 102 decodes the three bits of digital signals inputted to the digital input terminals IN1~IN3 to output differential switch control signals D1~D7.

Current supply transistors IS1~IS7 output currents in accordance with the bias voltage Vb supplied from the bias circuit 101 and inputted to the gate terminals of the transistors IS1~IS7, respectively.

The differential switches SW1~SW7 are switches which are turned on and off on the basis of the differential switch control signals D1~D7 outputted from the decoder 102, and the switches SW1~SW7 output the currents outputted from the current supply transistors IS1~IS7 to an analog output terminal OUT or a ground power supply VSS.

The analog output terminal OUT outputs an analog current according to the digital input signal.

When subjecting the D/A converter constituted as described above to package burn-in, an output load resistor 105 having a predetermined resistance value and performing current-to-voltage conversion must be connected to the analog output terminal OUT, after a predetermined output voltage is supplied from the external power supply 103 to the reference voltage input terminal VREF, and the external resistor 104 having a predetermined resistance value is connected to the reference resistor connection terminal IREF.

That is, during the package burn-in for the conventional D/A converter, it is necessary to perform, at least, connection of the external resistor for output load that is required for operation of the current output type D/A converter, connection of the external resistor for current value setting, and external application of the reference voltage for current value setting.

In such package burn-in, however, since the burn-in test is carried out after packaging the D/A converter, even parts to be screened as initial failures must be packaged as well, resulting in excessive cost or an expensive package.

In order to achieve cost reduction, recently, a wafer-level burn-in test has been executed. The wafer-level burn-in test is different from the package burn-in test in that the burn-in test is carried out on a wafer where resistors and wires are directly connected to pads on a semiconductor chip.

Another example of wafer-level burn-in is disclosed in Japanese Published Patent Application No.Hei.6-5677. As shown in FIG. 2 of this literature, passive elements such as resistors are formed around a semiconductor chip in a semiconductor wafer, instead of connecting external resistors or the like from the outside of the wafer, and the passive elements such as resistors are electrically connected to an input/output pad.

In the wafer-level burn-in, however, there are many cases where a space for connecting resistors and wires onto the wafer cannot be secured because of restrictions such as narrow spacing between pads on the semiconductor chip, and therefore, it may become impossible to carry out connection of the external resistor for output load, connection of the external resistor for current value setting, and external application of the reference voltage for current value setting, resulting in difficulty in executing the wafer-level burn-in test for the current output type D/A converter.

Further, when the passive elements such as resistors are formed around the semiconductor chip in the semiconductor wafer and electrically connected to the pads on the chip, there occurs a problem that a space for placing the passive elements cannot be secured, and a problem that a circuit of passive elements for wafer-level burn-in must be designed for each LSI when the pad interval or the like varies.

SUMMARY OF THE INVENTION

The present invention is made to solve the above-described problems and has for its object to provide a D/A converter that enables a wafer-level burn-in test without externally connecting resistor elements and the like for the burn-in test.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a current output type D/A converter comprises a control signal input terminal for receiving a control signal supplied from the outside, and an output load element having a switching mechanism for electrically connecting or disconnecting the output load element to/from an analog output node on the basis of the control signal applied to the control input terminal. Therefore, it is possible to control electrical connection/disconnection between the analog output node and the output load element on the basis of the control signal, whereby a wafer-level burn-in test for the D/A converter can be easily realized without connecting an external resistor for output load.

According to a second aspect of the present invention, in the D/A converter defined in the first aspect, the output load element is implemented by a MOS transistor having both of a switch function and a resistor function. Therefore, the circuit scale can be significantly reduced as compared with the case where the output load element comprises a resistor element and a switch.

According to a third aspect of the present invention, a current output type D/A converter comprises a resistor element for setting an output current value during a wafer-level burn-in mode, a switch for electrically connecting or disconnecting a reference resistor connected part to/from the resistor element during the wafer-level burn-in mode, and a control signal input terminal for receiving a control signal supplied from the outside. Therefore, it becomes possible to control electrical connection/disconnection between the resistor element and the reference resistor connected part by turning on/off the switch on the basis of the control signal inputted to the control input terminal, whereby a wafer-level burn-in test for the D/A converter can be easily realized without connecting an external resistor for current value setting.

According to a fourth aspect of the present invention, a current output type D/A converter comprises a reference voltage generation circuit for setting an output current value during a wafer-level burn-in mode, a switch for changing connection between a reference voltage applied part and the reference voltage generation circuit during the wafer-level burn-in mode, and a control signal input terminal for receiving a control signal supplied from the outside. Therefore, it becomes possible to control electrical connection/disconnection between the reference voltage generation circuit and the reference voltage applied part by turning on/off the switch on the basis of the control signal inputted to the control input terminal, whereby a wafer-level burn-in test for the D/A converter can be easily realized without externally applying a reference voltage for current value setting.

DETAILED DESCRIPTION OF THE PREFERRED EMBODIMENTS

[Embodiment 1]

Figure 1:
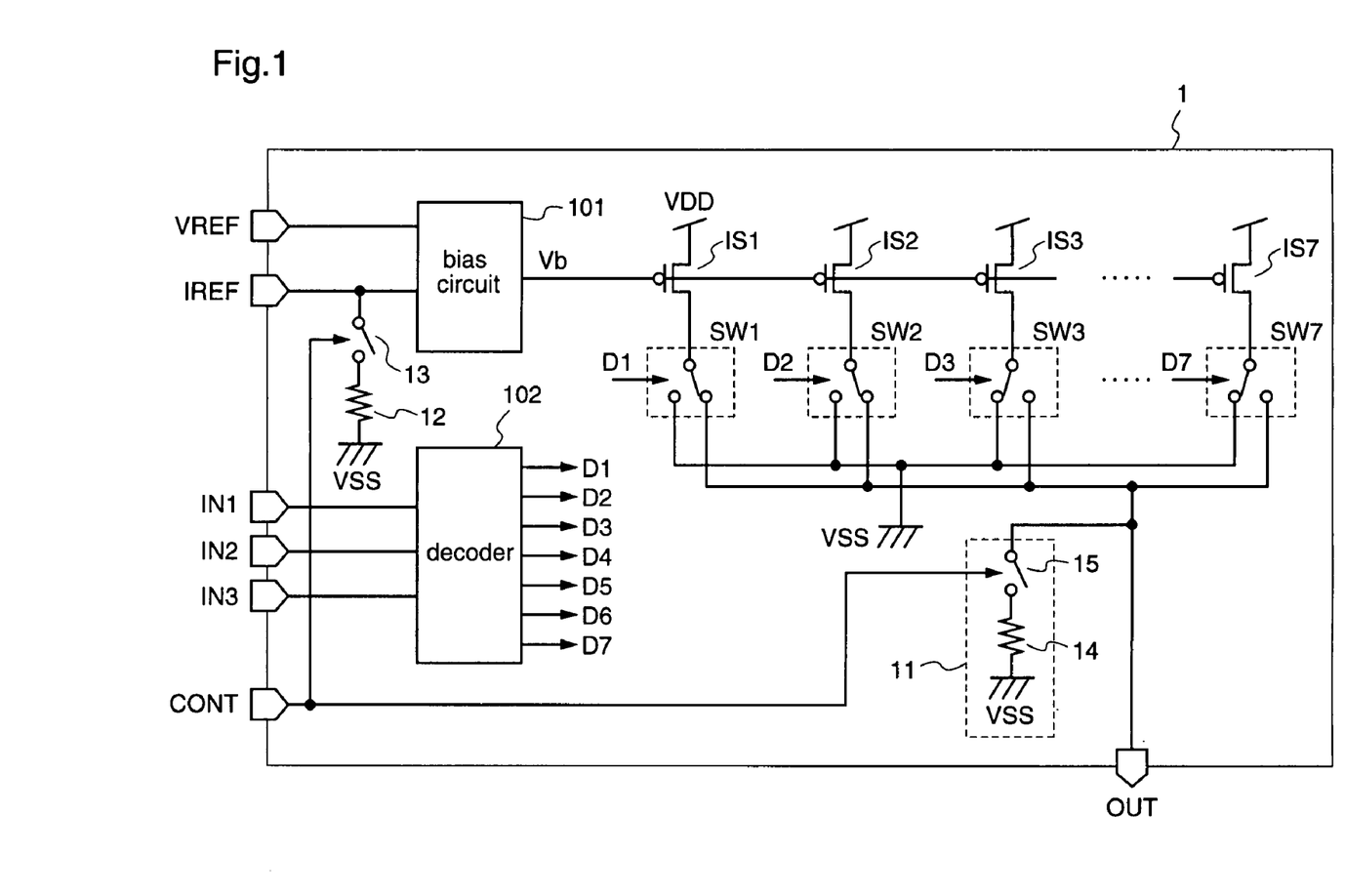
FIG. 1 is a diagram illustrating an example of a current output type D/A converter according to a first embodiment of the present invention.

Hereinafter, a D/A converter according to a first embodiment of the present invention will be described with reference to FIG. 1. FIG. 1 is a diagram illustrating an example of a current output type D/A converter according to the first embodiment.

In FIG. 1, a current output type D/A converter 1 comprises a reference voltage input terminal VREF, a reference resistor connection terminal IREF, digital input terminals IN1~IN3, a bias circuit 101 as a voltage generation circuit, a decoder 102, current supply transistors IS1~IS7, differential switches SW1~SW7, an analog output terminal OUT, a control signal input terminal CONT, an output load terminal 11, a resistor element 12, and a switch 13.

Figure 5:
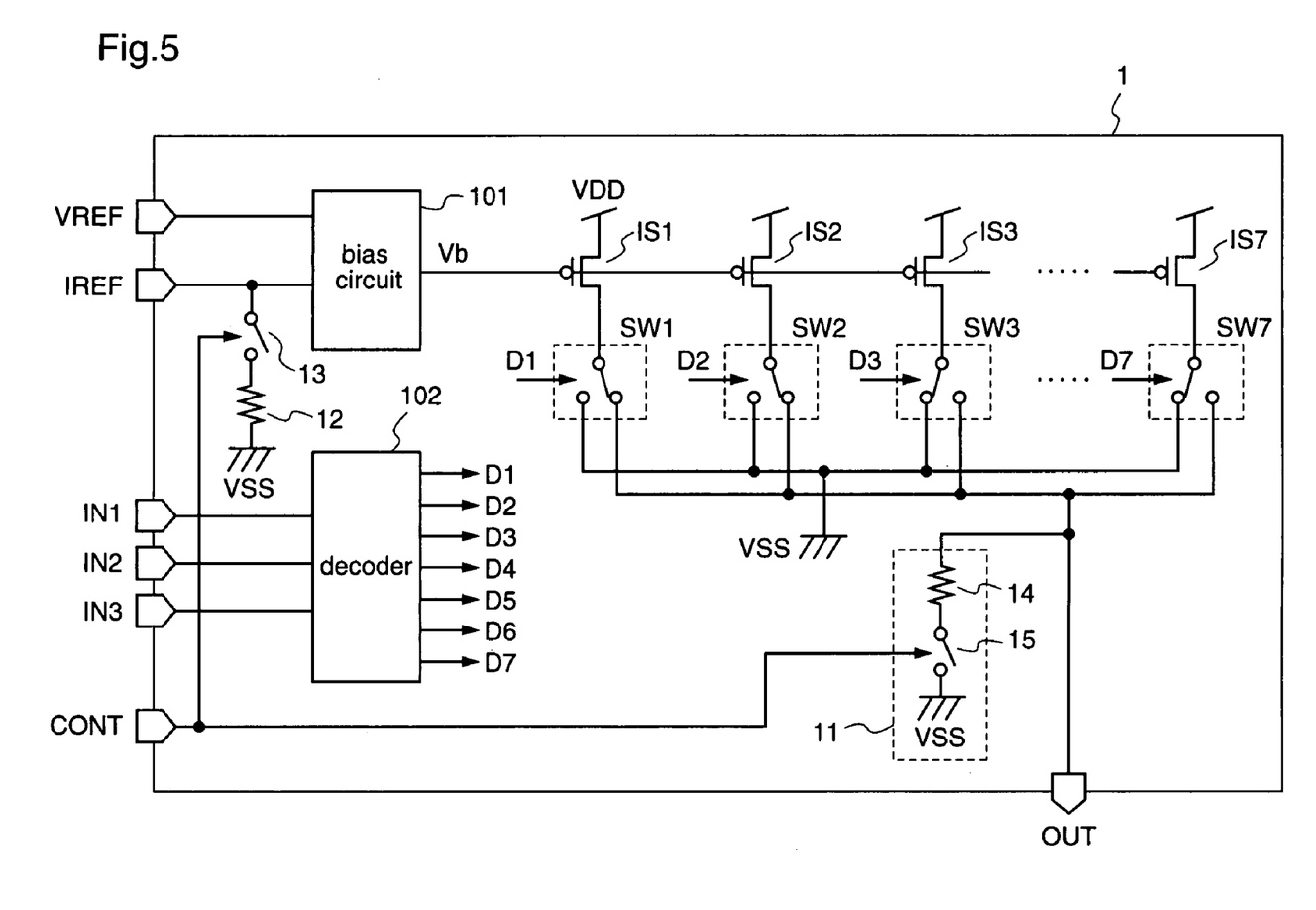
FIG. 5 is a diagram illustrating another example of a current output type D/A converter according to the first embodiment of the present invention.

In the current output type D/A converter 1 according to the first embodiment, the same reference numerals as those already described for the conventional D/A converter 100 shown in FIG. 5 denote the same or corresponding parts, and therefore, repeated description is not necessary.

The output load element 11 comprises a resistor element (first resistor element) 14 and a switch (first switch) 15. An end of the resistor element 14 is connected to a VSS power supply while the other end thereof is connected to the analog output terminal OUT through the switch 15. Further, ON/OFF of the switch 15 is controlled on the basis of a signal supplied from the control signal input terminal CONT. In the output load element 11, as shown in FIG. 5, an end of the resistor element 14 may be connected to the analog output terminal OUT while the other end thereof may be connected to the VSS power supply through the switch 15.

The resistor element (second resistor element) 12 is a resistor element for setting a current value. An end of the resistor element 12 is connected to a VSS power supply while the other end thereof is connected to a reference resistor connected part for giving a reference resistance to the bias circuit 101 through the switch (second switch) 13. Further, ON/OFF of the switch 13 is controlled on the basis of a signal supplied from the control signal input terminal CONT.

Next, the operation of the current output type D/A converter 1 will be described for a normal mode and a wafer-level burn-in mode, respectively. It is assumed that the switch 13 and the switch 15 are turned off when a "L" signal is supplied from the control signal input terminal CONT while the switch 13 and the switch 15 are turned on when a "H" signal is supplied from the control signal input terminal CONT.

Initially, in the normal operation mode, a "L" signal is input to the control signal input terminal CONT, whereby the switches 13 and 15 are turned off.

Therefore, the digital signals inputted to the digital input terminals IN1~IN3 are D/A converted through the bias circuit 101, the decoder 102, the current supply transistors IS1~IS7, and the differential switches SW1~SW7, without adversely affecting the normal operation by the output load element 11 and the resistor element 12 which are provided in the D/A converter 1 for wafer-level burn-in, and the obtained analog signals are output from the analog output terminal OUT.

On the other hand, in the wafer-level burn-in mode, a "H" signal is input to the control signal input terminal CONT, and the switches 13 and 15 are turned on, whereby the D/A converter goes into the state where wafer-level burn-in is executable.

In this mode, the output current of the D/A converter 1 is determined by the voltage applied to the VREF terminal from the outside, and the resistor element 12 included in the D/A converter 1, and therefore, it is not necessary to connect an external resistor to the IREF terminal. Further, the currents from the current supply transistors IS1~IS7 flow into the resistor element 14 that is a constituent of the output load element 11, and therefore, it is not necessary to connect an external resistor for output load to the OUT terminal.

As described above, in the D/A converter according to the first embodiment, the resistor element 14 is connected to the analog output terminal OUT through the switch 15, and the resistor element 12 is connected to the bias circuit 101 through the switch 13, whereby ON/OFF of the switches 15 and 13 are controlled on the basis of the signal supplied through the control signal input terminal CONT. Therefore, a waver-level burn-in test for the D/A converter can easily be carried out without connecting an external resistor for output load and an external resistor for current value setting.

Further, according to the first embodiment, since the output current of the D/A converter can be determined by the voltage applied to the VREF terminal and the resistor element 12, the output current value can be adjusted by controlling the voltage applied to the VREF terminal from the outside.

[Embodiment 2]

Figure 2:
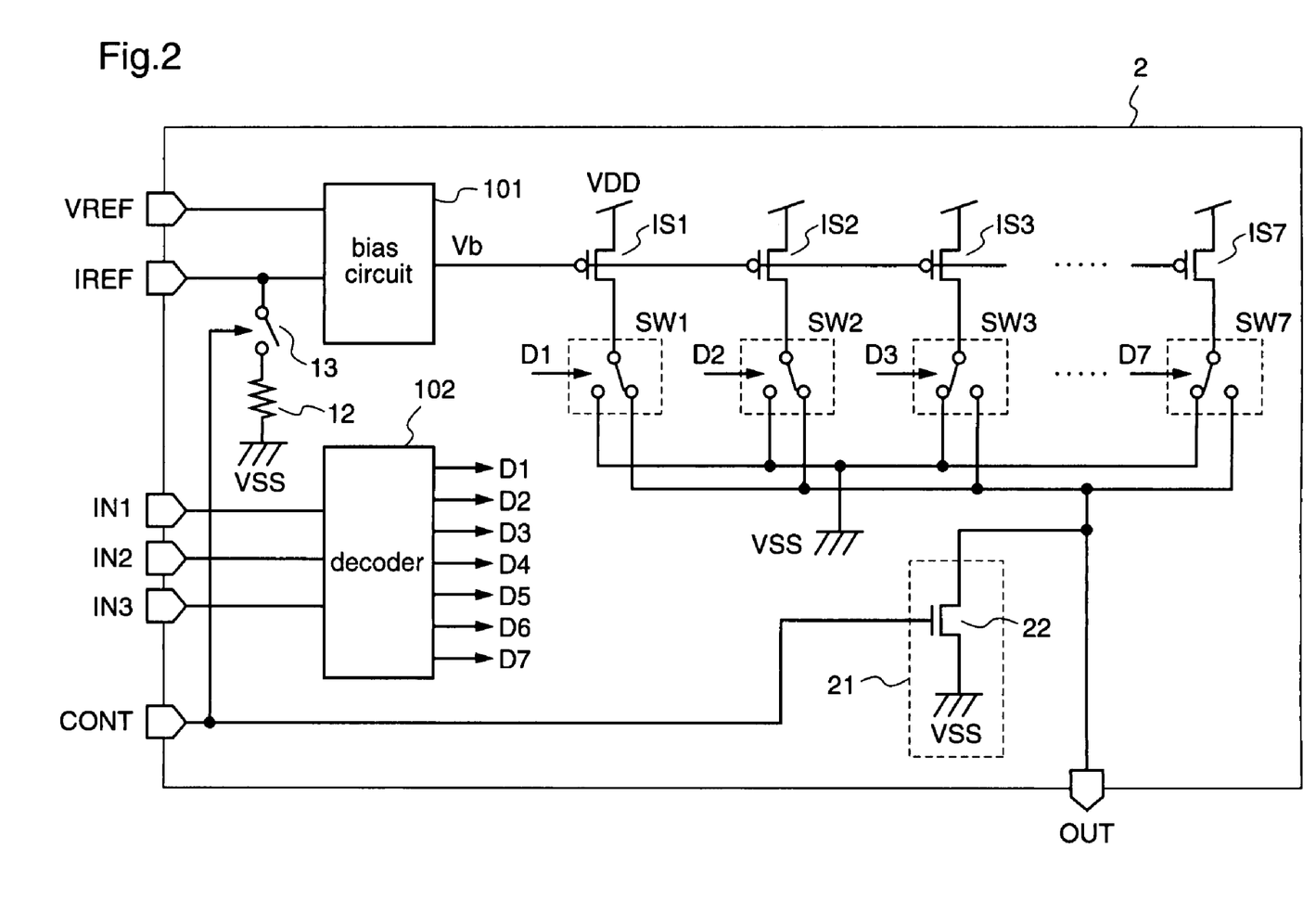
FIG. 2 is a diagram illustrating an example of a current output type D/A converter according to a second embodiment of the present invention.

Hereinafter, a D/A converter according to a second embodiment of the present invention will be described with reference to FIG. 2. FIG. 2 is a diagram illustrating an example of a current output type D/A converter according to the second embodiment.

In FIG. 2, a current output type D/A converter 2 according to the second embodiment comprises a reference voltage input terminal VREF, a reference resistor connection terminal IREF, digital input terminals IN1~IN3, a bias circuit 101 as a voltage generation circuit, a decoder 102, current supply transistors IS1~IS7, differential switches SW1~SW7, an analog output terminal OUT, a control signal input terminal CONT, an output load terminal 21, a resistor element 12, and a switch 13.

The current output type D/A converter 2 is different from the current output type D/A converter 1 according to the first embodiment in the construction of the output load element 21. The constituents of the D/A converter 2 other than the output load element 21 are identical to those described for the D/A converter 1 according to the first embodiment and, therefore, repeated description is not necessary.

The output load element 21 comprises only an N channel MOS transistor 22 having a source terminal connected to a VSS power supply and a drain terminal connected to an analog output terminal OUT. Further, a gate terminal of the N channel transistor 22 is connected to a control signal input terminal CONT, and ON/OFF of the N channel transistor 22 is controlled on the basis of a signal supplied from the control signal input terminal CONT.

Since the resistance value of the resistor element 12 is relatively large, even when the ON resistance of the switch 13 is relatively large, it presents no problem, and the area of the switch 13 can be reduced. On the other hand, since the resistance value of the resistor element 14 included in the current output type D/A converter 1 according to the first embodiment is relatively small, it is absolutely necessary to reduce the ON resistance of the switch 15 connected to the D/A converter 1. However, when the output load element 11 is constituted by the resistor element 14 and the switch 15 as in the first embodiment, the area of the element 14 becomes relatively large.

Therefore, in this second embodiment, the output load element 21 is constituted by only the N channel transistor 22 utilizing the voltage-current relationship in the unsaturated area of the N channel MOS transistor, thereby reducing the circuit scale.

To be specific, in the first embodiment where the output load element 11 comprises a switch and a resistor element, since the ON resistance of the switch must be minimized with respect to the resistance value of the resistor element, the size of the switch undesirably becomes about 10 um×20 um=200 um$^2$ while the size of the resistor element is about 2 um×2 um=4 um$^2$.

On the other hand, when the output load element 21 comprises only the N channel transistor as in this second embodiment, the size of the switch is about 2 um×20 um=40 um$^2$, whereby the area of the circuit is reduced to about ⅕ as compared with the case where the output load element 11 comprises the switch and the resistor element.

Next, the operation of the current output type D/A converter 2 according to the second embodiment will be described for the normal operation mode and the wafer-level burn-in mode, respectively. It is assumed that the switch 13 and the N channel transistor 22 are turned off when a "L" signal is supplied from the control signal input terminal CONT, and the switch 13 and the N channel transistor 22 are turned on when a "H" signal is supplied from the control signal input terminal CONT.

Initially, in the normal operation mode, the "L" signal is input to the control signal input terminal CONT, whereby the switch 13 and the N channel transistor 22 are turned off.

Therefore, the digital signals inputted to the digital input terminals IN1~IN3 are D/A converted through the bias circuit 101, the decoder 102, the current supply transistors IS1~IS7, and the differential switches SW1~SW7, without adversely affecting the normal operation by the output load element 21 and the resistor element 12 which are included in the D/A converter 2 for wafer-level burn-in, and the obtained analog signals are output from the analog output terminal OUT.

On the other hand, in the wafer-level burn-in mode, a "H" signal is input to the control signal input terminal CONT, and the switch 13 and the N channel transistor 22 are turned on, whereby the D/A converter goes into the state where wafer-level burn-in is executable.

In this mode, the output current of the D/A converter 2 is determined by the voltage applied to the VREF terminal from the outside, and the resistor element 12 included in the D/A converter 2, and therefore, it is not necessary to connect an external resistor to the IREF terminal. Further, the currents from the current supply transistors IS1~IS7 flow into the N channel transistor 22 that is a constituent of the output load element 21, and therefore, it is not necessary to connect an external resistor for output load to the OUT terminal.

As described above, in the D/A converter according to the second embodiment, the output load element 21 is constituted by only the N channel transistor 22 that has both the switching function and the resistor function, whereby the circuit area can be significantly reduced as compared with the case where the output load element comprises a resistor element and a switch.

Further, in the D/A converter 2 according to the second embodiment, the output load element 21 comprising the N channel transistor 22 is connected to the analog output terminal OUT while the resistor element 12 is connected through the switch 13 to the bias circuit 101, and ON/OFF of the N channel transistor 22 and the switch 13 are controlled on the basis of the signal supplied from the control signal input terminal CONT. Therefore, a wafer-level burn-in test for the D/A converter can be easily realized without connecting an external resistor for output load and an external resistor for current value setting.

Furthermore, since the D/A converter 2 according to the second embodiment can determine the output current of the D/A converter 2 on the basis of the voltage applied to the VREF terminal and the resistor element 12, the output current value can be adjusted by controlling the voltage applied to the VREF terminal from the outside.

[Embodiment 3]

Figure 3:
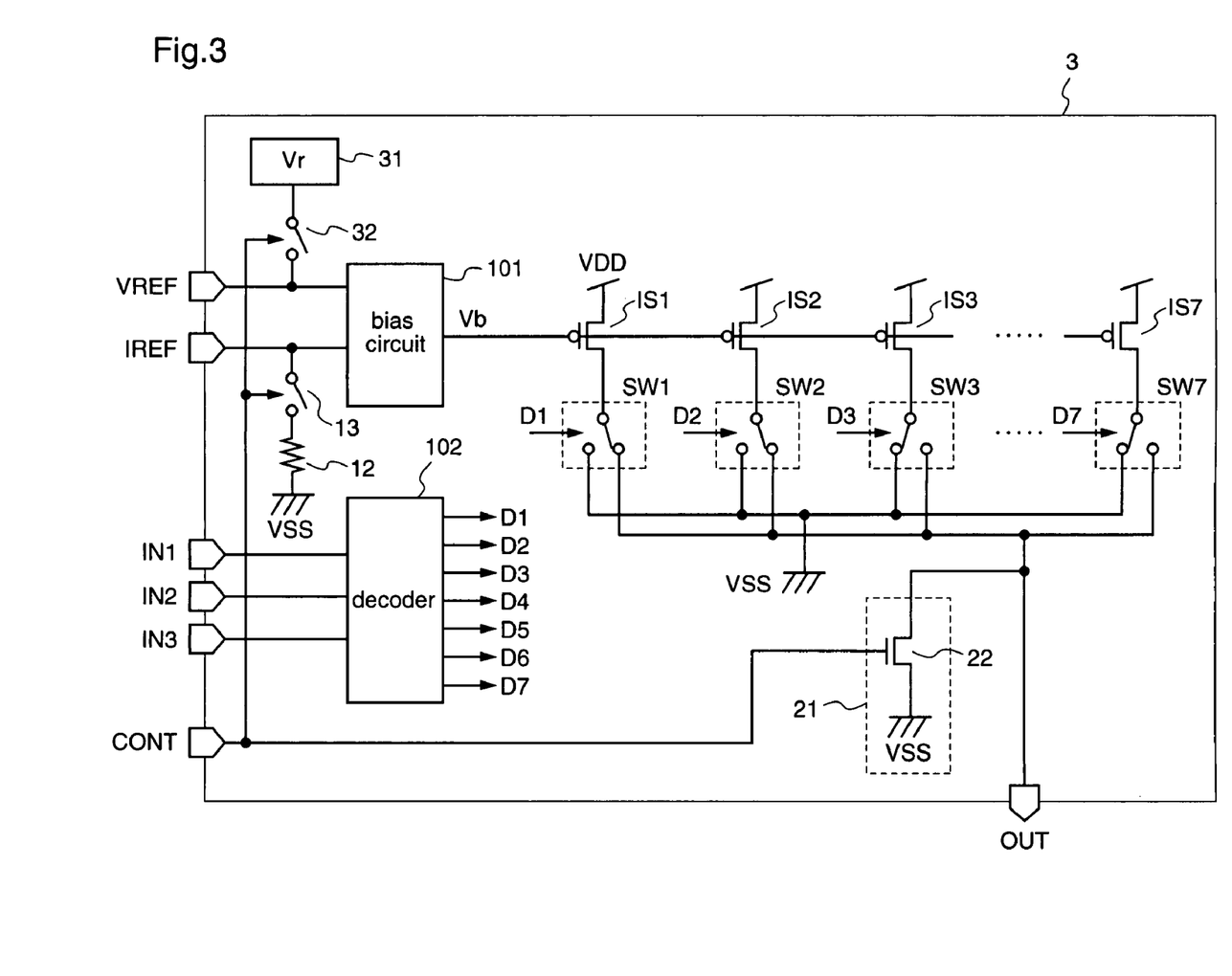
FIG. 3 is a diagram illustrating an example of a current output type D/A converter according to a third embodiment of the present invention.

Hereinafter, a D/A converter according to a third embodiment of the present invention will be described with reference to FIG. 3. FIG. 3 is a diagram illustrating an example of a current output type D/A converter according to the third embodiment.

In FIG. 3, a current output type D/A converter 3 according to the third embodiment comprises a reference voltage input terminal VREF, a reference resistor connection terminal IREF, digital input terminals IN1~IN3, a bias circuit 101 as a voltage generation circuit, a decoder 102, current supply transistors IS1~IS7, differential switches SW1~SW7, an analog output terminal OUT, a control signal input terminal CONT, an output load terminal 21 comprising an N channel transistor 22, a resistor element 12, a switch 13, a reference voltage generation circuit 31, and a switch 32.

The current output type D/A converter 3 according to the third embodiment is obtained by adding the reference voltage generation circuit 31 and the switch 32 to the current output type D/A converter 2 according to the second embodiment. The constituents of the D/A converter 3 other than the reference voltage generation circuit 31 and the switch 32 are identical to those described for the D/A converter 2 according to the second embodiment and, therefore, repeated description is not necessary.

The reference voltage generation circuit 31 is connected to a reference voltage application unit for applying a reference voltage through a switch (third switch) 32 to the bias circuit 101. Further, ON/OFF of the switch 32 is controlled on the basis of a signal supplied from the control signal input terminal CONT.

Next, the operation of the current output type D/A converter 3 according to the third embodiment will be described for the normal operation mode and the wafer-level burn-in mode, respectively. It is assumed that the switch 13, the N channel transistor 22, and the switch 32 are turned off when a "L" signal is supplied from the control signal input terminal CONT, and the switch 13, the N channel transistor 22, and the switch 32 are turned on when a "H" signal is supplied from the control signal input terminal CONT.

Initially, in the normal operation mode, the "L" signal is input to the control signal input terminal CONT, whereby the switch 13, the N channel transistor 22, and the switch 32 are turned off.

Therefore, the digital signals inputted to the digital input terminals IN1~IN3 are D/A converted through the bias circuit 101, the decoder 102, the current supply transistors IS1~IS7, and the differential switches SW1~SW7, without adversely affecting the normal operation by the output load element 21, the resistor element 12, and the reference voltage generation circuit 31 which are included in the D/A converter 3 for wafer-level burn-in, and the obtained analog signals are output from the analog output terminal OUT.

On the other hand, in the wafer-level burn-in mode, a "H" signal is input to the control signal input terminal CONT, and the switch 13 and the N channel transistor 22 are turned on, whereby the D/A converter goes into the state where wafer-level burn-in is executable.

In this mode, the output voltage of the reference voltage generation circuit 31 is applied to the bias circuit 101. Therefore, the output current of the D/A converter 3 is determined by the output voltage of the reference voltage generation circuit 31 and the resistor element 12, which are included in the D/A converter 3, and therefore, it is not necessary to supply the reference voltage input terminal VREF with a reference voltage from the outside. Further, the currents from the current supply transistors IS1~IS7 flow into the N channel transistor 22 that is a constituent of the output load element 21, and therefore, it is not necessary to connect an external resistor for output load to the OUT terminal.

As described above, in the D/A converter 3 according to the third embodiment, the output load element 21 comprising the N channel transistor 22 is connected to the analog output terminal OUT, the resistor element 12 is connected through the switch 13 to the bias circuit 101, the reference voltage generation circuit 31 is connected through the switch 32 to the bias circuit 101, and ON/OFF of the N channel transistor 22, the switch 13, and the switch 32 is controlled on the basis of the signal supplied from the control signal input terminal CONT. Therefore, a wafer-level burn-in test for the D/A converter can be easily realized without performing connection of the external resistor for output load, connection of the external resistor for current value setting, and external application of the reference voltage for current value setting.

Further, in the D/A converter 3 according to the third embodiment, since the output load element 21 is constituted by only the N channel transistor, the circuit scale can be significantly reduced as compared with the case where the output load element comprises a resistor element and a switch.

[Embodiment 4]

Hereinafter, a D/A converter according to a fourth embodiment of the present invention will be described with reference to FIG. 4.

Figure 4:
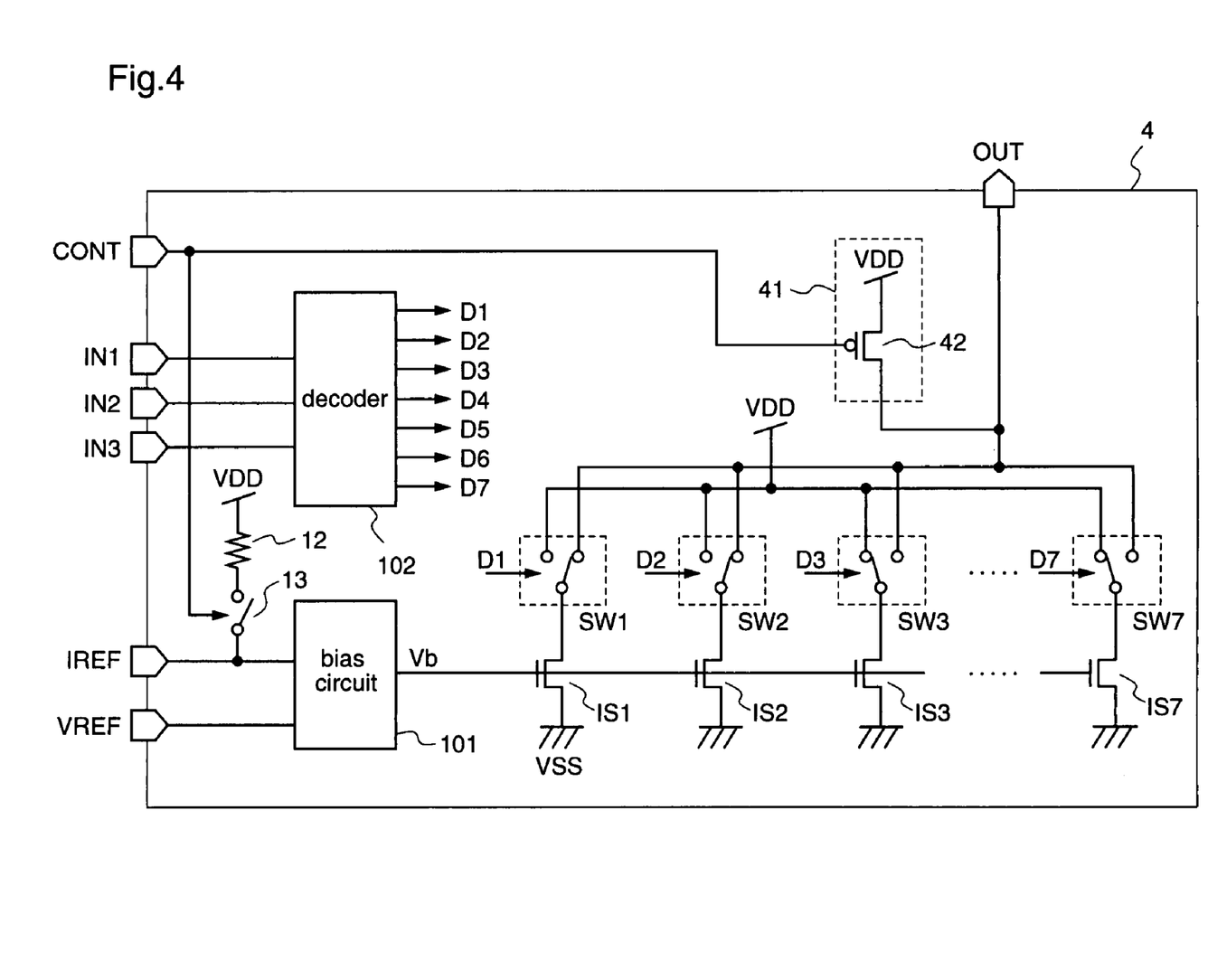
FIG. 4 is a diagram illustrating an example of a current output type D/A converter according to a fourth embodiment of the present invention.

FIG. 4 is a diagram illustrating an example of a current output type D/A converter according to a fourth embodiment of the invention.

In FIG. 4, the current output type D/A converter 4 comprises a reference voltage input terminal VREF, a reference resistor connection terminal IREF, digital input terminals IN1~IN3, a bias circuit 101 as a voltage generation circuit, a decoder 102, current supply transistors IS1~IS7, differential switches SW1~SW7, an analog output terminal OUT, a control signal input terminal CONT, an output load terminal 42 comprising a P channel transistor 42, a resistor element 12, and a switch 13.

The current output type D/A converter 4 is different from the current output type D/A converter 2 according to the second embodiment in that the P channel transistor 42 is used instead of the N channel transistor 22 and the power supply can be switched between the ground power supply VSS and the power supply VDD. The constituents of the D/A converter 4 other than the above-mentioned points are identical to those described for the D/A converter 2 according to the second embodiment and, therefore, repeated description is not necessary.

The output load element 41 comprises only the P channel MOS transistor 42 having a source terminal connected to the VDD power supply terminal and a drain terminal connected to the analog output terminal OUT. Further, a gate terminal of the P channel transistor 42 is connected to the control signal input terminal CONT, and ON/OFF of the P channel transistor 42 is controlled on the basis of a signal supplied from the control signal input terminal CONT.

The P channel transistor 42 has both of the switching function and the resistor function like the N channel transistor 22 described for the second embodiment, thereby reducing the circuit scale.

Next, the operation of the current output type D/A converter 2 according to the fourth embodiment will be described for the normal operation mode and the wafer-level burn-in mode, respectively. It is assumed that the switch 13 and the P channel transistor 42 are turned off when a "L" signal is supplied from the control signal input terminal CONT, and the switch 13 and the P channel transistor 42 are turned on when a "H" signal is supplied from the control signal input terminal CONT.

Initially, in the normal operation mode, the "L" signal is input to the control signal input terminal CONT, whereby the switch 13 and the P channel transistor 42 are turned off.

Therefore, the digital signals inputted to the digital input terminals IN1~IN3 are D/A converted through the bias circuit 101, the decoder 102, the current supply transistors IS1~IS7, and the differential switches SW1~SW7, without adversely affecting the normal operation by the output load element 41 and the resistor element 12 which are included in the D/A converter 4 for wafer-level burn-in, and the obtained analog signals are output from the analog output terminal OUT.

On the other hand, in the wafer-level burn-in mode, a "H" signal is input to the control signal input terminal CONT, and the switch 13 and the P channel transistor 42 are turned on, whereby the D/A converter goes into the state where wafer-level burn-in is executable.

In this mode, the output current of the D/A converter 4 is determined by the voltage applied to the VREF terminal from the outside, and the resistor element 12 included in the D/A converter 4, and therefore, it is not necessary to connect an external resistor to the IREF terminal. Further, the currents from the current supply transistors IS1~IS7 flow into the N channel transistor 42 that is a constituent of the output load element 41, and therefore, it is not necessary to connect an external resistor for output load to the OUT terminal.

As described above, in the D/A converter according to the fourth embodiment, the output load element 41 is constituted by only the P channel transistor 42 that has both the switching function and the resistor function, whereby the circuit area can be significantly reduced as compared with the case where the output load element comprises a resistor element and a switch.

Further, in the D/A converter 4 according to the fourth embodiment, the output load element 41 comprising the P channel transistor 42 is connected to the analog output terminal OUT while the resistor element 12 is connected through the switch 13 to the bias circuit 101, and ON/OFF of the P channel transistor 42 and the switch 13 is controlled on the basis of the signal supplied from the control signal input terminal CONT. Therefore, a wafer-level burn-in test for the D/A converter can be easily realized without connecting an external resistor for output load and an external resistor for current value setting.

Furthermore, the D/A converter 4 according to the fourth embodiment can determine the output current of the D/A converter 4 on the basis of the voltage applied to the VREF terminal and the resistor element 12, the output current value can be adjusted by controlling the voltage applied to the VREF terminal from the outside.

Furthermore, while in the first to fourth embodiments of the present invention a D/A converter for converting a three-bit digital signal into an analog signal is described, the number of bits of a digital signal to be input to the D/A converter is not particularly limited.

The D/A converter according to the present invention easily realizes a wafer-level burn-in test and, therefore, it is very valuable.

What is claimed is:

1. A current output type D/A converter for converting a digital signal into an analog signal, said current output type D/A converter comprising:
    a control signal input terminal operable to receive a control signal supplied from the outside; and
    an output load element having a switching mechanism operable to electrically connect or disconnect said output load element to/from an analog output node, on the basis of the control signal applied to said control input terminal.

2. A D/A converter as defined in claim 1,
    wherein said output load element comprises a field effect transistor; and
    wherein said field effect transistor electrically connects or disconnects itself to/from said analog output node on the basis of the control signal inputted to said control input terminal.

3. A D/A converter as defined in claim 2, wherein said field effect transistor is a MOS transistor.

4. A D/A converter as defined in claim 3,
    wherein said MOS transistor is an N channel MOS transistor; and
    wherein said N channel MOS transistor has a drain terminal connected to an analog output terminal, a source terminal connected to a ground voltage, and a gate terminal to which the control signal is applied.

5. A semiconductor integrated circuit equipped with a D/A converter as defined in claim 4.

6. A D/A converter as defined in claim 3,
    wherein said MOS transistor is a P channel MOS transistor; and
    wherein said P channel MOS transistor has a drain terminal connected to an analog output terminal, a source terminal connected to a power supply voltage, and a gate terminal to which the control signal is applied.

7. A semiconductor integrated circuit equipped with a D/A converter as defined in claim 6.

8. A semiconductor integrated circuit equipped with a D/A converter as defined in claim 3.

9. A semiconductor integrated circuit equipped with a D/A converter as defined in claim 2.

10. A D/A converter as defined in claim 1, wherein said switching mechanism included in said output load element electrically disconnects said output load element from said analog output node during normal operation mode while it electrically connects said output load element to said analog output node during wafer-level burn-in mode, on the basis of the control signal inputted to said control input terminal.

11. A semiconductor integrated circuit equipped with a D/A converter as defined in claim 10.

12. A D/A converter as defined in claim 1,
wherein said output load element comprises a first resistor element and a first switch; and
wherein said first switch electrically connects or disconnects said first resistor element to/from said analog output node on the basis of the control signal inputted to said control input terminal.

13. A semiconductor integrated circuit equipped with a D/A converter as defined in claim 12.

14. A D/A converter as defined in claim 1, further comprising:
a resistor element for setting an output current value during the wafer-level burn-in mode; and
a second switch operable to connect or disconnect a reference resistor connected part to/from said resistor element during the wafer-level burn-in mode;
wherein said second switch electrically connects or disconnects said reference resistor connected part to/from said resistor element on the basis of the control signal inputted to said control input terminal.

15. A semiconductor integrated circuit equipped with a D/A converter as defined in claim 14.

16. A D/A converter as defined in claim 1, further comprising:
a reference voltage generation circuit operable to set an output current value during the wafer-level burn-in mode; and
a second switch operable to electrically connect or disconnect a reference voltage application part to/from said reference voltage generation circuit during the wafer-level burn-in mode;
wherein said second switch electrically connects or disconnects said reference voltage application part to/from said reference voltage generation circuit on the basis of the control signal inputted to said control input terminal.

17. A semiconductor integrated circuit equipped with a D/A converter as defined in claim 16.

18. A semiconductor integrated circuit equipped with a D/A converter as defined in claim 1.

19. A D/A converter as defined in claim 1, wherein said output load element is not external to said D/A converter.

* * * * *